United States Patent
Gotsmann et al.

(10) Patent No.: US 9,543,492 B2
(45) Date of Patent: Jan. 10, 2017

(54) THERMOELECTRIC ELEMENTS (71) Applicant: International Business Machines Corporation, Armonk, NY (US)

(72) Inventors: Bernd W. Gotsmann, Rueschlikon (CH); Siegfried F. Karg, Rueschlikon (CH); Heike E. Riel, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 179 days.

(21) Appl. No.: 13/966,659

(22) Filed: Aug. 14, 2013

(65) Prior Publication Data

US 2014/0060601 A1 Mar. 6, 2014

(30) Foreign Application Priority Data

Aug. 29, 2012 (GB) .................................... 1215342.5

(51) Int. Cl.
*H01L 35/32* (2006.01)
*H01L 35/28* (2006.01)

(52) U.S. Cl.
CPC .................................... *H01L 35/28* (2013.01)

(58) Field of Classification Search
CPC .......... H01L 35/12; H01L 35/30; H01L 35/32; H01L 35/00; H01L 35/02; H01L 35/04; H01L 35/28; H01L 35/34
USPC ........................................................ 136/200
See application file for complete search history.

(56) References Cited

U.S. PATENT DOCUMENTS

| 7,888,583 | B2 | 2/2011 | Lagally et al. | |
|---|---|---|---|---|
| 2008/0081388 | A1 | 4/2008 | Yasseri et al. | |
| 2008/0276979 | A1 | 11/2008 | Lagally et al. | |
| 2010/0252086 | A1* | 10/2010 | Fujie | 136/238 |
| 2012/0025343 | A1* | 2/2012 | Kuekes | H01L 35/32 257/467 |
| 2012/0097204 | A1* | 4/2012 | Yu et al. | 136/200 |

(Continued)

FOREIGN PATENT DOCUMENTS

| CN | 102132430 A | 7/2011 |
|---|---|---|
| JP | 2006173398 A | 6/2006 |

(Continued)

OTHER PUBLICATIONS

M. Liangruksa, et al., "Lattice Thermal Conductivity of a Silicon Nanowire under Surface Stress," Journal of Applied Physics, 109, 113501, pp. 1-9, 2011.

(Continued)

*Primary Examiner* — Jennifer Michener
*Assistant Examiner* — Bethany L Martin
(74) *Attorney, Agent, or Firm* — Cantor Colburn LLP (57) ABSTRACT

A thermoelectric element includes a body formed of a single thermoelectric material and extending in a first direction along which a thermal gradient is established in thermoelectric operation, wherein the body has at least first and second adjacent sections in the first direction; at least one of the sections is subject to stress which is applied to that section substantially all around a central axis of the body in the first direction; and the arrangement is such that the stress results in different strain in the first and second sections producing an energy barrier in the body to enhance thermoelectric operation.

8 Claims, 6 Drawing Sheets

(56) References Cited

U.S. PATENT DOCUMENTS

| | | | |
|---|---|---|---|
| 2013/0125948 A1* | 5/2013 | Kawaguchi | H01L 35/32 |
| | | | 136/203 |
| 2014/0137916 A1* | 5/2014 | Roh et al. | 136/203 |
| 2014/0224296 A1* | 8/2014 | Kobayashi et al. | 136/212 |

FOREIGN PATENT DOCUMENTS

| | | |
|---|---|---|
| JP | 2009054968 A | 3/2009 |
| WO | 02080280 A1 | 10/2002 |
| WO | 2012066444 A1 | 5/2012 |

OTHER PUBLICATIONS

Hinsche, et al. "Thermoelectric transport in strained Si and Si/Ge heterostructures," J. of Physics: Condensed Matter; 24, 2012, pp. 1-15.
Vashaee, et al., "Improved Thermoelectric Power Factor in Metal-based Superlattices," Physical Review Letters, vol. 92, No. 10, Mar. 12, 2004, pp. 1-4.
Y. Xu, et al., "Strain Effect Analysis on the Thermoelectric Figure of Merit in n-type Si/Ge Nanocomposites," Journal of Applied Physics 111, 054318, 2012, pp. 1-15.
GB Intellectual Property Office; Application No. GB1215342.5; Patents Act 1977: Search Report Under Section 17(5); Date Mailed: Dec. 21, 2012; pp. 1-4.
Paul et al., "Enhancement of thermoelectric efficiency by uniaxial tensile stress in n-type GaAs nanowires", 2011 11th IEEE International Conference on Nanotechnology, Aug. 15-18, 2011, pp. 1352-1356.

\* cited by examiner

▓ strained

▒ unstrained

THERMOELECTRIC ELEMENTS

PRIORITY

This application claims priority to Great Britain Patent Application No. 1215342.5, filed Aug. 29, 2012, and all the benefits accruing therefrom under 35 U.S.C. §119, the contents of which in its entirety are herein incorporated by reference.

BACKGROUND

This invention relates generally to thermoelectric elements. Thermoelectric elements are provided together with structures and devices incorporating such elements.

Thermoelectric energy converters (TECs) are devices which use thermoelectric materials for energy conversion. Thermoelectric materials exhibit the thermoelectric effect whereby a thermal gradient is generated in the material in response to an applied voltage, or a voltage is generated across the material on application of a thermal gradient. TECs can thus be used to derive electrical power from a thermal gradient or to generate a thermal gradient for heating or cooling purposes from an applied voltage.

The efficiency of a TEC is expressed by the dimensionless thermoelectric figure of merit ZT. This can be described by the expression $ZT = \sigma S^2/\kappa T$, where $\sigma$ is the electrical conductivity, $\kappa$ is the thermal conductivity, T is the absolute temperature, and S is the Seebeck coefficient. It is generally assumed that a ZT value of 3 to 4 is required for economic power generation on a large scale. In bulk materials, $\sigma$, S and $\kappa$ are interdependent and a ZT of greater than 1 is known to be difficult to achieve. Recent progress using nano-structured materials suggests that these parameters can be tuned separately. Nano-composites and superlattices combining metallic and semiconducting materials show a higher power factor $\sigma S^2$ than their respective bulk materials. These heterostructures combining different materials offer improved performance due to the energy filtering effect of electronic barriers. This effect, whereby an energy barrier is formed due to the particular combination of materials in the heterostructure, is discussed, for example, in "Improved Thermoelectric Power Factor in Metal-based Superlattices", Vashaee et al., Physical Review Letters, Vol. 92, No. 10, 2004.

Current state-of-the-art nano-composite based TECs achieve ZT values of 2 at best, and the maximum value is achieved only at very high temperatures or in a very narrow temperature range. Studies on one-dimensional systems such as semiconducting nanowires have shown that this geometry can enhance ZT by lowering the thermal conductivity $\kappa$. However, a general problem in heterostructures is the presence of interface states that tend to lower electrical conductance due to uncontrolled charge carrier scattering. Fabrication of suitable structures is also difficult and expensive. While heterostructures based on planar and one-dimensional nanostructures offer more precise control of the electronic barriers than nano-particle based composites, these require even more expensive fabrication techniques. In the case of nanowire arrays, for instance, the volume density poses an additional problem.

US Patent Application Publication US2008/0276979 discloses a strain superlattice nanowire. Quantum dots are arranged in anti-phase on opposite surfaces of a nanoribbon, whereby the dots on opposite surfaces are not positioned directly opposite one another but are at offset positions along the length of the ribbon. Lattice mismatch between the dot and ribbon materials induces intermittent surface strain modulation, producing a periodic variation in the band gap of the ribbon and hence a miniband structure for increasing the Seebeck coefficient.

SUMMARY

In one embodiment, a thermoelectric element includes a body formed of a single thermoelectric material and extending in a first direction along which a thermal gradient is established in thermoelectric operation, wherein the body has at least first and second adjacent sections in the first direction; at least one of the sections is subject to stress which is applied to that section substantially all around a central axis of the body in the first direction; and the arrangement is such that the stress results in different strain in the first and second sections producing an energy barrier in the body to enhance thermoelectric operation.

BRIEF DESCRIPTION OF THE SEVERAL VIEWS OF THE DRAWINGS

Exemplary embodiments of the invention will now be described, by way of example, with reference to the accompanying drawings in which.

DETAILED DESCRIPTION

An embodiment of a first aspect of the present invention provides a thermoelectric element comprising a body formed of a single thermoelectric material and extending in a first direction along which a thermal gradient is established in thermoelectric operation. In this element: the body has at least first and second adjacent sections in the first direction; at least one of the sections is subject to stress which is applied to that section substantially all around a central axis of the body in the first direction; and the arrangement is such that the stress results in different strain in the first and second sections producing an energy barrier in the body to enhance thermoelectric operation.

In thermoelectric elements embodying this invention, therefore, the body is formed of a single thermoelectric material. The body has extent in (at least) a first direction with which the thermal gradient will be aligned in operation. Stress is applied to at least one of first and second sections of the body which are adjacent one another in this first direction. In a body-section which is subject to stress, the stress is applied to that section substantially all around a notional central axis, extending in the first direction, of the body. The applied stress induces different strain in the first and second body-sections, and this strain differential produces an energy barrier in the body to enhance the thermoelectric effect. Thus, embodiments of this invention use strain modulation to improve thermoelectric performance in a single-material, thereby avoiding the problems associated with heterostructures discussed above. According to embodiments of the invention the stress applied to the body-section(s) to produce the strain modulation is applied to any given body-section substantially all around the central axis of the body. Because of this, the entire cross-section of the body-section will be strained, ensuring reliable formation of a miniband structure over the entire cross-section. In operation, therefore, there can be no alternative paths for electrical current to flow through the body in the first direction and avoid the strained regions.

Embodiments of the present invention offer efficient thermoelectric elements which provide effective band-gap modulation through strain in a single material. In addition, the applied stress can be easily tuned to give the desired strain for particular operating conditions. This and other advantages will be discussed in connection with particular embodiments below.

The different strain in the first and second sections of the body may result from only one section being strained, i.e., the strain may be zero in one section and non-zero in the other. Alternatively, both sections may be strained but to differing extents. In general, the stress which produces strain in a body-section may be tensile or compressive, and may be lateral, i.e., transverse or generally perpendicular to the central axis, or axial, i.e., along or generally parallel to the central axis, or a combination of the two. The strain induced by this stress may similarly involve lateral and/or axial strain fields. In any case, however, the stress is applied to a body-section substantially all around the central axis. Hence, the stress on a section is applied to material of the body substantially on all sides of the central axis as viewed in cross section, so that material on all sides of the axis is subject to strain as discussed above.

In some embodiments, at least one of the first and second body-sections has a stressor layer formed on the surface thereof to apply stress to that section. Depending on body geometry, such a stressor layer may entirely surround the section in a direction around the central axis. The stressor layer may be formed on only one of the first and second sections, and the stress applied by this stressor layer may be sufficient in itself to produce the strain differential creating the energy barrier, i.e., without any additional applied stress and/or strain modulation mechanism to be described. As an alternative, or in addition in other embodiments, both of the first and second sections may be subject to stress via force applied to the body in the first direction. In particular, axial stress may be imposed via force applied at each end of the body in the first direction. Where such axial stress is employed, the first and second body-sections may be differently shaped, e.g., having different widths perpendicular to the central axis, such that the applied force causes different strain in the two sections. In simple embodiments, this effect may be sufficient in itself to produce the energy barrier without any other stress or strain modulation mechanism.

The surface of at least one of the first and second body-sections may be shaped to scatter phonons for reducing thermal conductance of the body, further enhancing thermoelectric operation. In embodiments with an applied stressor layer, the stressor layer may be adapted to reduce thermal conductance in the body. This effect could be achieved by appropriately selecting the stressor layer so as to exploit phonon leakage from the body into the stressor layer. Alternatively, or in addition, the surface of the stressor layer may be shaped to promote phonon scattering.

In exemplary embodiments, the body has a plurality of pairs of the first and second sections along its extent in the first direction. Each of the sections preferably has a length in the first direction in a range of about 1 to 1000 nm, ideally in a range of about 10 to 100 nm.

The body may be elongate in the first direction, for example comprising a nanowire of any desired cross-sectional shape (where this shape could be different in the first and second body-sections). Common examples include rounded (e.g., circular) cross-sections as well as generally rectangular cross-sections giving a ribbon-shaped nanowire (nanoribbon). Other embodiments may employ a sheet-like body, i.e., a layer of material which extends in both the first direction and laterally thereof to form a generally two-dimensional sheet (which may or may not be substantially planar). With this or other body-geometries, a thermoelectric structure may be formed from a stack of such elements. In particular, an embodiment of a second aspect of the invention provides a thermoelectric structure comprising a plurality of thermoelectric elements according to embodiments of the first aspect of the invention, the elements being arranged in a stack with the central axes thereof substantially parallel and aligned with each other. The elements in the stack may be integrally formed with one another.

An embodiment of a third aspect of the invention provides a thermoelectric device comprising a plurality of thermoelectric elements according to the first aspect of the invention, wherein the elements are arranged side by side with the central axes thereof substantially parallel and aligned with each other, each element extending between respective electrical contacts at the ends of the body in the first direction.

Figure 1:
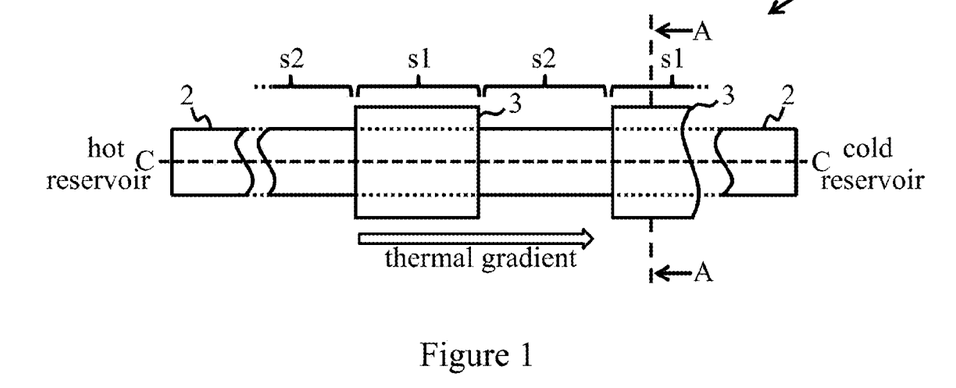
FIG. 1 is a schematic illustration of a first thermoelectric element embodying the invention.
Figure 2:
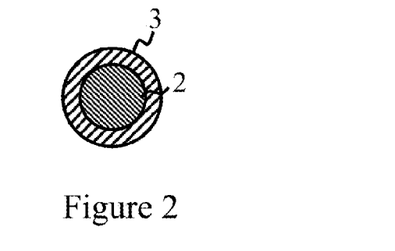
FIG. 2 is a cross-sectional view of the element of FIG. 1.

FIG. 1 shows the structure of a first embodiment of a thermoelectric element. The element 1 comprises an elongate body 2 which is formed of a single thermoelectric material. The body 2 is formed by a nanowire which has a substantially circular cross-section in this example. The longitudinal direction of nanowire 2 defines the direction along which a thermal gradient will be established during thermoelectric operation, as indicated by the arrow in figure. Hence, element 1 will be arranged for operation between two regions of different temperature (denoted by "hot reservoir" and "cold reservoir" in the figure), with notional longitudinal axis CC, which extends substantially centrally of the nanowire along its length, extending in the direction of the thermal gradient. A plurality of pairs of adjacent sections s1, s2 is defined in the longitudinal direction of nanowire 2 such that sections s1 and s2 alternate along the length of the nanowire. The first section s1 has a stressor layer 3 formed on the surface thereof to apply stress to that section of the nanowire. FIG. 2 is a schematic cross-section through a section s1 in direction A-A of FIG. 1. In this example, the stressor layer 2 is formed as a coating which surrounds the body-section, extending all around the central axis CC. The adjacent second section s2 is defined by a region of the nanowire having no stressor layer 3. By way of example, the nanowire 2 may have a length of the order of micrometers or tens of micrometers, typically about 5 μm, and a width of the order of nanometers or tens of nanometers, typically about 50 nm. Sections s1 and s2 may each have a length of the order of nanometers or tens of nanometers, and is typically about 20 nm in this example.

Figure 3:
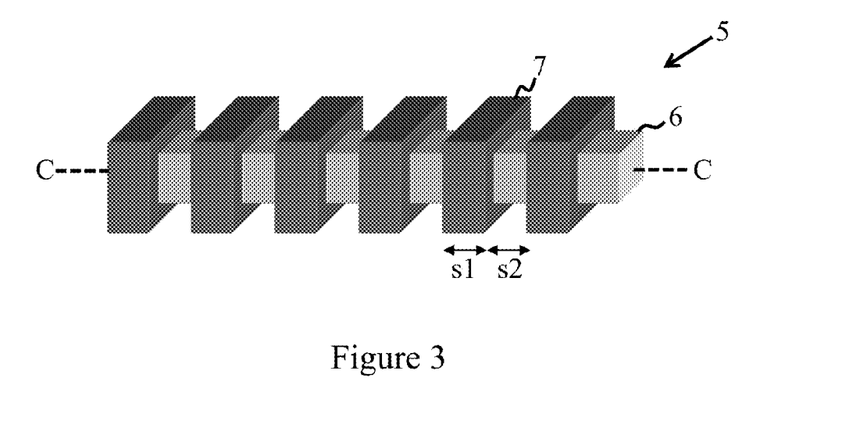
FIG. 3 is a schematic illustration of a second thermoelectric element embodying the invention.
Figure 4A:
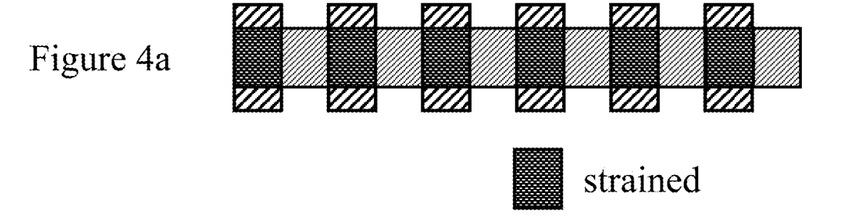
FIGS. 4A and 4B are cross-sectional views of the element of FIG. 3.
Figure 4B:
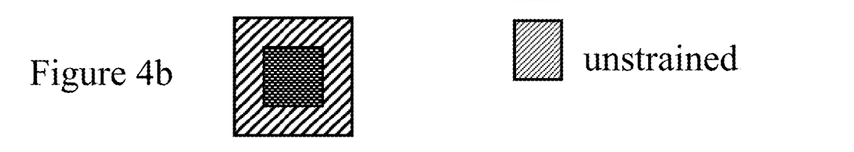

As discussed further below, the stressor layer 3 serves to apply stress to section s1 of the nanowire. Since the stressor layer surrounds the body-section s1 here, the stress is applied to that section all around the central axis CC, so that material on all sides of the axis is subject to stress. The applied stress induces strain in body section s1, this strain extending over the entire cross-section of s1. With this particular configuration, radial strain can be induced between the surface of the body section and central axis CC. However, longitudinal strain (along axis CC) can also be applied using an appropriate stressor layer in such an embodiment. The particular direction of the strain field depends on whether the applied stress is tensile or compressive. Section s2, in contrast, is not subject to stress, and so this body-section is not strained. The effect is therefore to produce a pattern of strain modulation along the length of nanowire 2. FIGS. 3, 4A and 4B illustrate the strain modulation effect more clearly. FIG. 3 illustrates a thermoelectric element 5 corresponding generally to element 1 but based on a nanowire body 6 having a substantially square cross-section. A stressor layer 7 is applied as a coating around each body-section s1, with adjacent section s2 having no stressor layer. FIG. 4A shows a longitudinal cross-section of element 5, indicating the resulting strain modulation pattern. FIG. 4B is a cross-section perpendicular to central axis CC through a section s1, showing strain over the entire cross-section of the body-section.

The stress applied by stressor layer 3, 7 in the above embodiments is determined (based on various factors, such as materials and operating parameters as discussed further below) so that the resulting strain differential between sections s1 and s2 has the effect of producing an energy barrier in the nanowire 2, 6 to enhance thermometric operation. This effect will be explained in relation to the schematic energy band diagrams of FIGS. 5A and 5B.

Figure 5A:
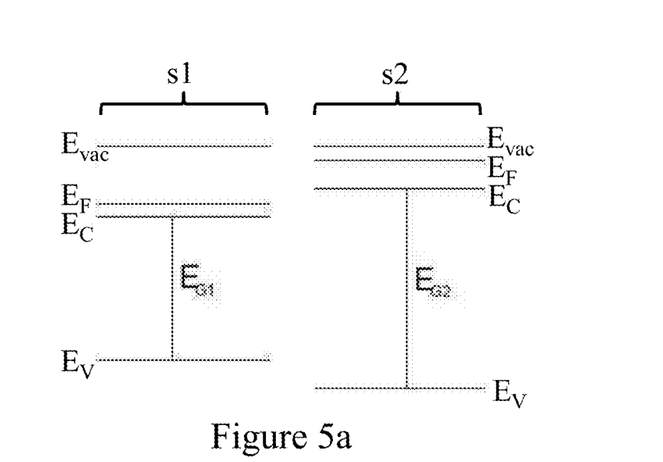
FIGS. 5A and 5B are exemplary energy band diagrams illustrating formation of an energy barrier in embodiments of the invention.

FIG. 5A shows exemplary energy band diagrams for respective conductors corresponding to the two sections s1 (on the left) and s2 (on the right) of the body of a thermoelectric element 1, 5 embodying the invention. $E_V$ represents the valence band edge and $E_C$ the conduction band edge, whereby $EG_1$ denotes the band gap corresponding to section s1 and $EG_2$ denotes the band gap corresponding to section s2. $E_F$ represents the Fermi energy in each case, and $E_{VAC}$ represents the vacuum energy level. It will be seen that the two conductors have differing Fermi energies and conduction band edges, with the Fermi energy being close to (and here above) the conduction band edge.

Figure 5B:
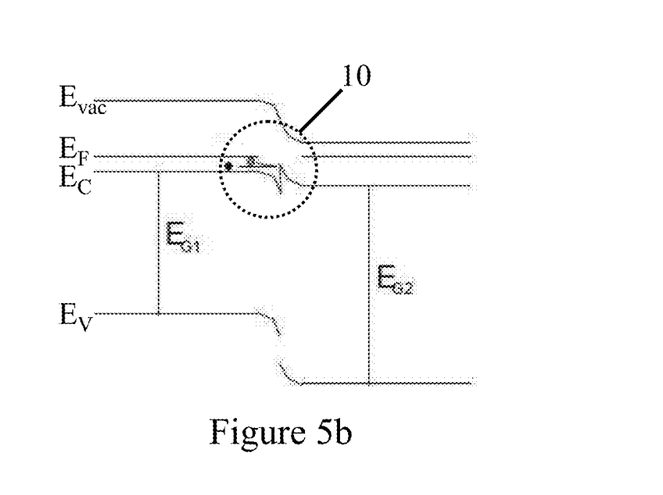

The effect of contact of the conductors corresponding to sections s1 and s2 is indicated in FIG. 5B. Upon contact, the Fermi energies $E_F$ align and an energy filtering barrier is created as indicated at 10 in the figure. This energy barrier will block some of the conduction electrons near the Fermi energy, leading to an increased Seebeck coefficient and so improvement in the thermoelectric effect.

By analogy with FIGS. 5A and 5B, application of stress to induce strain in sections s1 of elements 1, 5 causes the conduction band edge in s1 to be shifted upwardly (in this example) and the Fermi energies of sections s1 and s2 to align, thereby forming an energy barrier in the body 2, 6. By appropriate selection of parameters $E_C$ and $E_F$ as described above, body section s2 (or s1 in other examples) can be viewed as a barrier section and an energy barrier is formed at the interface between sections s1 and s2. The alternating pattern of sections s1 and s2 along the length of nanowire body 2, 6 permits efficient energy barrier formation in elements of practical lengths. An energy filtering superlattice is thus achieved by modification of the same material through strain, avoiding problems associated with prior heterostructure superlattices. Moreover, because the entire cross-section of body-sections s1 is strained, an efficient miniband structure is achieved with the energy band modulation being exhibited over the whole cross-section of the nanowire, avoiding alternative current paths which would otherwise decrease element efficiency.

Nanowires for use in elements 1, 5 can be fabricated using known processing techniques, and the materials of the nanowire and stressor layer can be selected as appropriate to achieve the energy filtering structure described above. In particular, the materials can be selected such that the conduction band edge of the barrier section (s2 above) is within range of the Fermi energy of the adjacent section (s1 above). Typically, the barrier-section conduction band should be within a range of the order of kT of the Fermi energy of the adjacent section, where k is the Boltzmann constant and T is absolute temperature. The nanowire material will typically have a Fermi energy which is near to, and preferably above, the conduction band edge. Doped semiconductors are good examples of suitable materials since the Fermi energy is usually very close to the conduction band in these materials. Strain caused by the applied stress then shifts the conduction band edge up or down, depending on the particular material and type of strain induced by the stressor layer, to form the energy barrier. The stressor layer can be formed on the nanowire, and patterned to produce the sections s1, using generally known processing techniques such as atomic layer deposition, chemical vapor deposition, molecular beam epitaxy, and so on. Patterning can be achieved in the usual manner using masking and/or etching techniques for example.

The stressor layer may be formed of material which is inherently adapted to apply stress to the nanowire, e.g., due to differences in crystal structure between the stressor layer and nanowire, such as differences in lattice constants, or the particular bonding angles at the material interface resulting in intrinsic growth stress, or due to differences in thermal expansion coefficients of the stressor layer and nanowire. In other embodiments, the stressor layer may be formed as a preliminary layer which is post-processed to apply stress to the nanowire, e.g., a layer which undergoes a volume change on post processing, e.g., due to an amorphous/crystalline phase transition induced by a heat treatment. Examples of such techniques for forming a stressor layer on a nanowire are described in our copending International Patent Application publication no. WO2012/066444.

As will be understood by those skilled in the art, many factors affect the nature and degree of strain that will be induced in a particular nanowire by a particular stressor layer. These factors include the particular interface chemistry between the materials in question, e.g., how the chemical bonds are formed and the particular lengths and angles of these bonds, and the crystal structure of the materials e.g., lattice constants and crystal directions. As well as materials, the dimensions, e.g., thicknesses, of the stressor layer and nanowire are also relevant to strain characteristics. A thicker stressor layer may apply more stress, and a thinner nanowire may be more easily strained. When fabricating elements 1, 5, therefore, particular materials and process parameters can be chosen to achieve the desired strain characteristics for energy barrier formation. Suitable materials and processes will be readily apparent to those skilled in the art based on the principles described herein.

In one exemplary implementation, nanowire 2, 6 may be formed of Si and the stressor layer 3, 7 may be formed of $Si_{1-x}Ge_x$ to achieve a band gap modulation of approximately 210 meV/GPa. In another example, nanowire 2, 6 may be formed of GaAs and the stressor layer 3, 7 may be formed of InGaAs/AlGaAs to achieve a band gap modulation of approximately 80 meV/GPa. Structuring of the stressor layer to provide sections s1 can be achieved via lithography, thin-film growth and etching, or any other convenient method.

Figure 6:
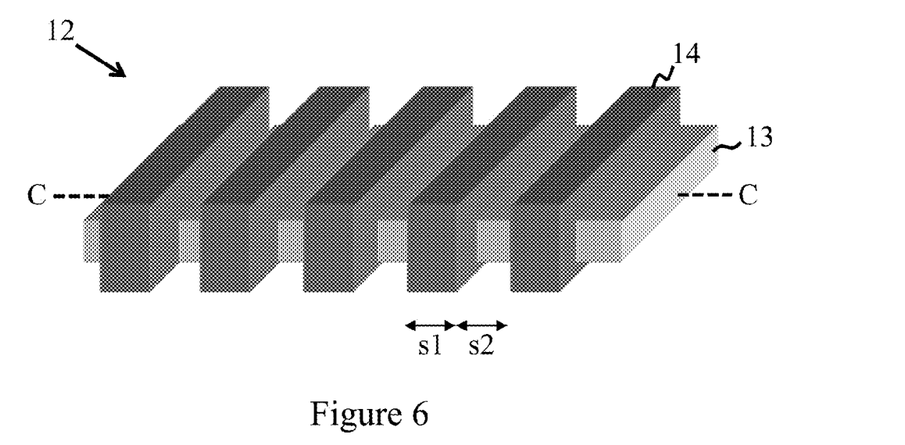
FIGS. 6 and 7 illustrate sheet-like thermoelectric elements embodying the invention.

FIG. 6 is a schematic illustration of another thermoelectric element embodying the invention. This element 12 is broadly similar to element 5 of FIG. 2 but extended laterally to obtain a sheet-like geometry. That is, the body 13 of this element extends in both the direction of central axis CC and also laterally thereof, forming a substantially planar sheet in this instance. The width of body 13 might typically be of the order of tens or hundreds of nanometers, and may be similar to its length in axial direction CC along which the thermal gradient is established. Apart from the sheet-like geometry, the structure of element 12 corresponds generally to that of element 5. Hence, body 13 has alternating sections s1, s2 in the direction of central axis CC, with each section s1 being defined by a stressor layer 14 which surrounds the body-section around the central axis. Each section s2 has no stressor layer and is therefore unstrained. As before, the repeating pattern of sections s1, s2 provides a superlattice of strain variation, resulting in band gap modulation over the entire cross-section and enhanced thermoelectric effect.

Figure 7:
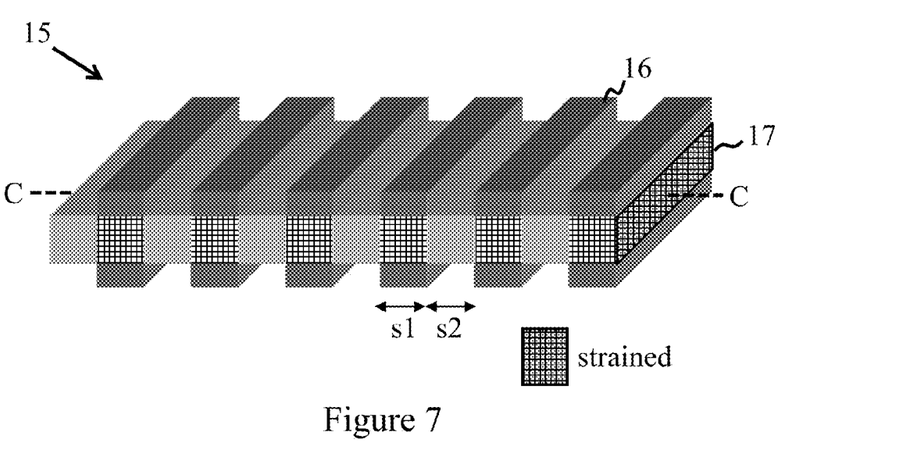

FIG. 7 shows another sheet-like thermoelectric element embodying the invention. This element 15 is identical to element 12 of FIG. 6 except that the stressor layer 16 does not completely surround the planar body 17. In particular, stressor layer 16 does not extend over the side edges of the sheet. However, because the stressor layer extends across the whole of the upper and lower surfaces in this geometry, stress is still applied to each body section s1 substantially all around the central axis CC. In particular, stress is applied to the body material substantially on all sides of the central axis as viewed in cross section, so that the entire cross-section is strained as indicated by the hatching in the figure. Again, therefore, this element structure provides effective band-gap modulation over the entire cross-section of the body.

Figure 8:
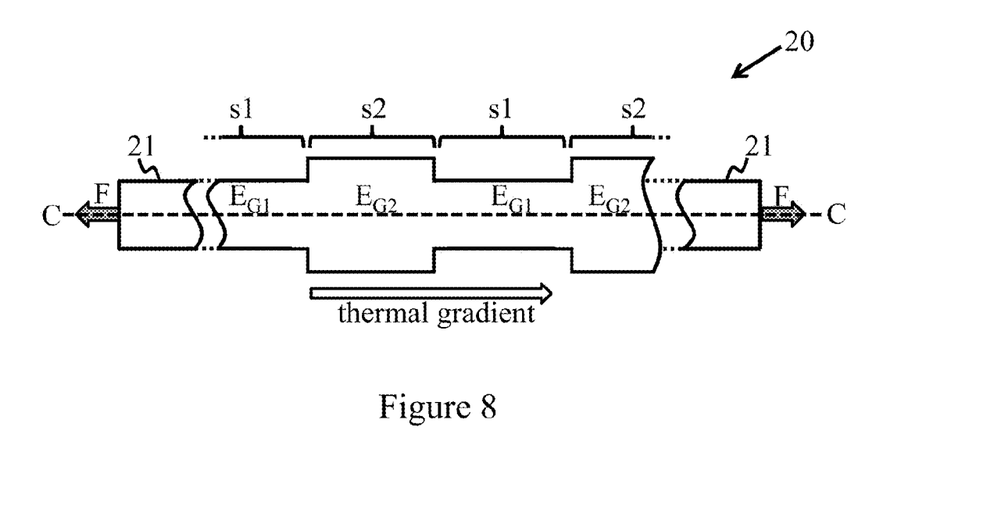
FIG. 8 is a schematic illustration of a further thermometric element embodying the invention.
Figure 9A:
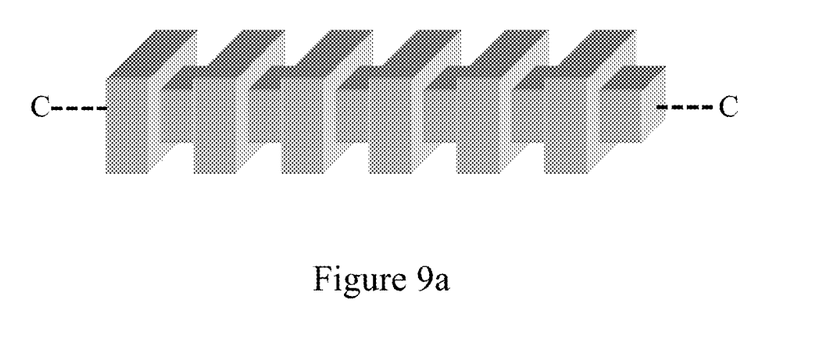
FIGS. 9A and 9B show another thermoelectric element embodying the invention.
Figure 9B:
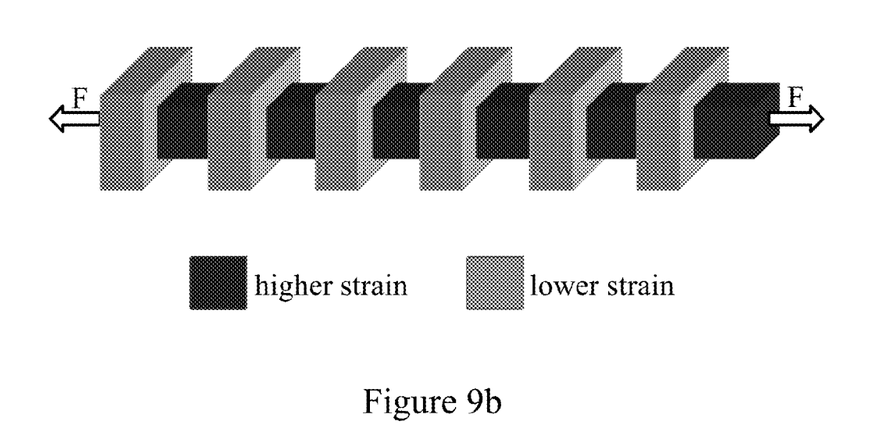

FIG. 8 shows the structure of a different type of thermoelectric element embodying the invention. This element 20 again has an elongate body formed by nanowire 21 with substantially circular cross-section and formed of a single thermoelectric material. Longitudinal axis CC again defines the direction along which a thermal gradient will be established in operation. As before, a plurality of pairs of adjacent sections s1, s2 is defined along the length of nanowire 21. Here, however, the body-sections s1 and s2 are differently shaped, having different widths perpendicular to central axis CC. With this circular geometry, therefore, the sections s1 and s2 have different diameters in cross-section. In this example, dimensions may be generally similar to corresponding dimensions for the nanowire elements described above, subject to the additional variation in nanowire diameter. This variation will depend on the desired strain characteristics in a given implementation. In particular, each of the first and second body-sections s1, s2 is subject to stress via force F applied to the body in the direction of central axis CC. The force F applied to the ends of nanowire 21 in this example applies tensile stress in the axial direction of the nanowire. Thus, each of sections s1 and s2 along the length of the nanowire is subject to axial stress due to the applied force. In each body section s1 or s2, the stress is applied in the axial direction substantially all around the central axis CC. Again, therefore, the stress on a body-section is applied to material of the body substantially on all sides of the central axis as viewed in cross section, so that material on all sides of the axis is subject to strain. The entire cross-section of the nanowire is therefore strained. However, the induced strain will be different in s1 and s2 due to the different geometry of these sections. FIGS. 9A and 9B illustrate the strain modulation effect for a thermoelectric element 25 similar to element 20 but having a substantially square cross-section. FIG. 9A shows the unstressed element and FIG. 9B shows the element subject to stress via applied force F. Each of the sections s1, s2 is subject to strain but to differing extents, as indicated by the different shading in FIG. 9B.

The strain differential between the differently-shaped sections s1, s2 of elements 20 and 25 is such that an energy barrier is formed in the body. Hence, the different band gaps $E_{G1}$ and $E_{G2}$ of sections s1 and s2 result in creation of an energy barrier via the mechanism described above, enhancing the thermoelectric effect in the element. Again, since stress is applied substantially all around central axis CC and the entire cross-section is strained, the energy band modulation is exhibited over the whole cross-section of the nanowire and alternative current paths are avoided.

Shaped nanowires for use in elements 20, 25 can again be fabricated using known processing techniques, and the materials, geometrical variation and applied force can be adapted as appropriate to achieve the desired energy filtering superlattice. In exemplary implementations, the nanowire material may be a group IV semiconductor such as silicon or germanium, or a compound semiconductor of III-V semiconductor groups, such as GaAs, InAs, or InSb, or of II-VI semiconductor groups such BiTe, BiSb, PbTe, etc. Pattering of the nanowire to obtain the geometry variation can be achieved via lithography or etching for example. The force F applied to stress the nanowire can be applied by any convenient mechanism and suitable techniques will be apparent to those skilled in the art. The force is conveniently applied by appropriate spacing of support structures which support the nanowire at its ends in the thermoelectric device. This spacing may be determined to give a required force for a given device or could be dynamically adjustable in some embodiments.

Figure 10A:
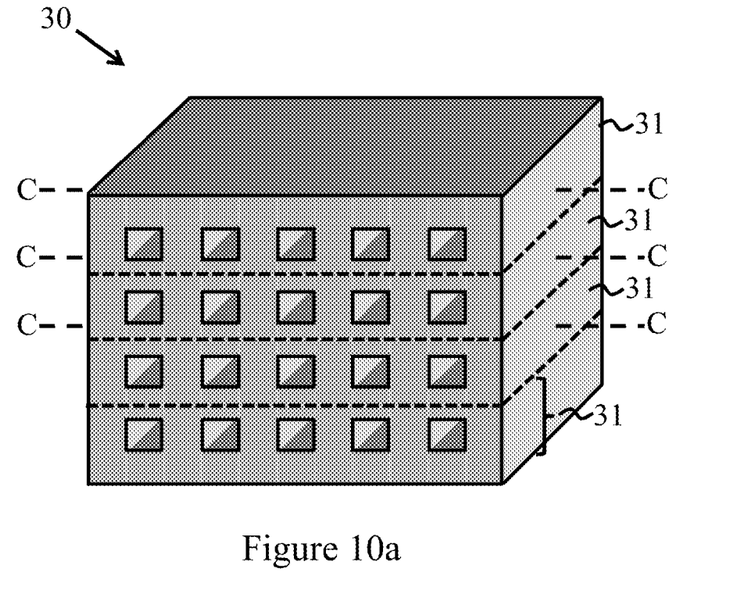
FIGS. 10A and 10B illustrate a thermoelectric structure embodying the invention.
Figure 10B:
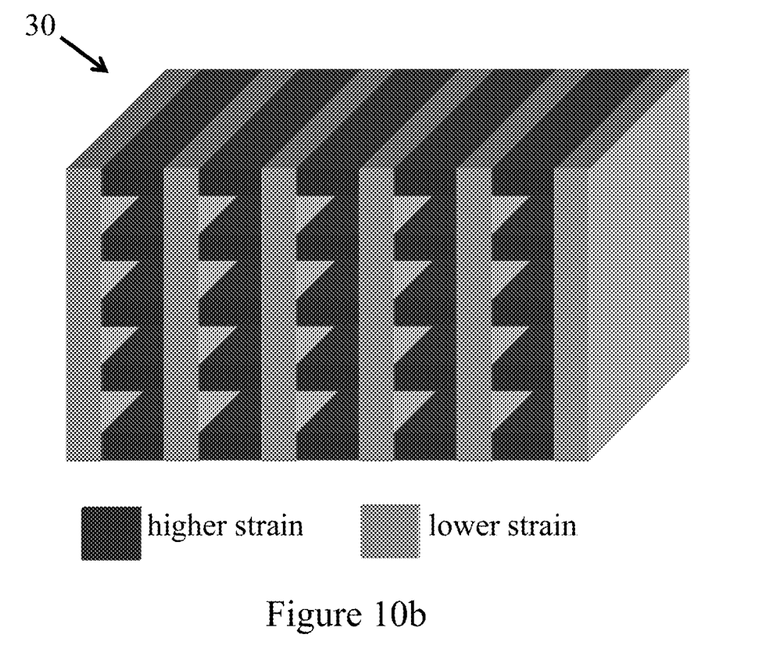

The nanowire embodiment of FIG. 9A can be readily extended to two-dimensional sheet-like elements similar to element 12 of FIG. 6. Similarly, the basic structure of such sheet-like elements can be readily repeated to form three-dimensional, bulk structures. In particular, a thermoelectric structure may be formed from a plurality of thermoelectric elements arranged in a stack with the central axes thereof substantially parallel and aligned with each other. FIG. 10A is a schematic illustration of an exemplary thermoelectric structure 30 in which a plurality of sheet-like elements 31 are arranged one above the other in a parallel, aligned arrangement. The elements 31 are integrally formed with one another to produce an integral stack structure. Each sheet-like element 31 is essentially a two-dimensional implementation of the one-dimensional nanowire structure of FIG. 9A. FIG. 10B shows the structure 30 stressed by applied force F, indicating the strain modulation in elements 31 corresponding to that of FIG. 9B.

It is a particular advantage of the embodiments described that the strain characteristics are easily tuned, permitting optimization for particular operational parameters. For example, devices are ideally optimized for operation in a specific temperature window. The temperatures of the hot and cold reservoir dictate the optimum strain characteristics. These temperatures can vary significantly under realistic operating conditions, inhibiting optimal performance. In embodiments using stressor layers, however, the layers can be readily designed to produce stress in dependence on the specific operating temperatures to be employed, thereby optimizing efficiency. The applied stress can be adjusted dynamically in a simple manner, e.g., by choosing appropriate thermal expansion coefficient mismatches between the stressor layer and thermoelectric body material. For example, Si and Ge have thermal expansion coefficients of $2.6 \times 10^{-6} K^{-1}$ and $5.9 \times 10^{-6} K^{-1}$ at 300 K. In embodiments using external force F and geometry variation, the parameters are again easily tuned to actual operating temperatures, e.g., simply by varying the force F. In this way, the energy barrier height can be adapted to working temperatures via strain adjustment, further enhancing efficiency in operation.

A further advantage is that mechanisms employed for strain modulation can additionally enhance operation by modifying thermal conductance of the resulting structures. For example, geometrical variation of the element body to produce the strain modulation may result in the surface of at least one of the first and second body-sections being shaped so as to scatter phonons against their preferred direction of travel. This has the effect of reducing thermal conductance of the body, further enhancing thermoelectric operation. Reduction of thermal transport through surface modification has been previously demonstrated for asymmetrically-shaped surfaces, e.g., having a saw-tooth or grating-like surface structure. By employing such asymmetrical surface structuring for the geometrical variation used to achieve strain modulation, embodiments of the invention can conveniently reduce thermal conductance at the same time as increasing the Seebeck coefficient (thermopower). Alternatively, or in addition, in embodiments with an applied stressor layer, the stressor layer may be adapted to reduce thermal conductance in the body. This effect could be achieved by appropriately selecting the stressor layer so as to exploit the known phenomenon of phonon leakage into the body from the stressor layer. The surface of the stressor layer might also be shaped to promote phonon scattering. The stressor layer can thus be designed to cause a reduction of thermal conductance while simultaneously modulating strain to enhance thermopower.

Figure 11:
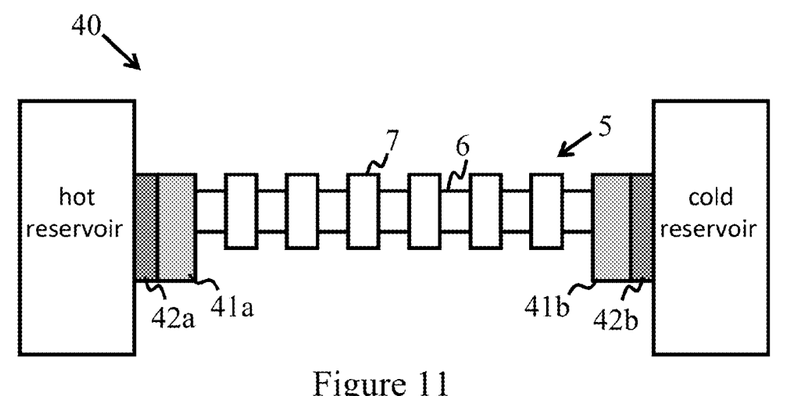
FIG. 11 is a schematic illustration of a thermoelectric device based on nanowire elements embodying the invention.

Thermoelectric elements embodying the invention can be used in various arrangements in thermoelectric devices. FIG. 11 shows the basic arrangement of a thermoelectric element in an elementary thermoelectric converter (TEC) device 40. This example shows an element 5 connected between electrical contacts 41a, 41b at respective ends of the body 6 for output of current generated in operation. The electrical contacts are in thermal contact with respective reservoirs 42a, 42b providing the temperature differential for thermoelectric operation. Electrically insulating thermal contacts 43 may be provided between the reservoirs and electric contacts in some arrangements.

Figure 12:
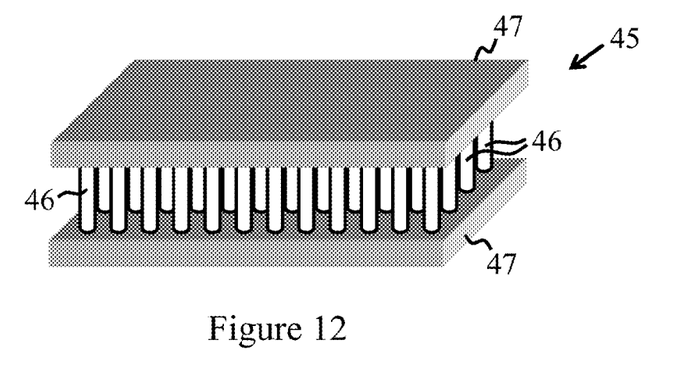
FIG. 12 is a schematic illustration of an array of nanowire elements.
Figure 13:
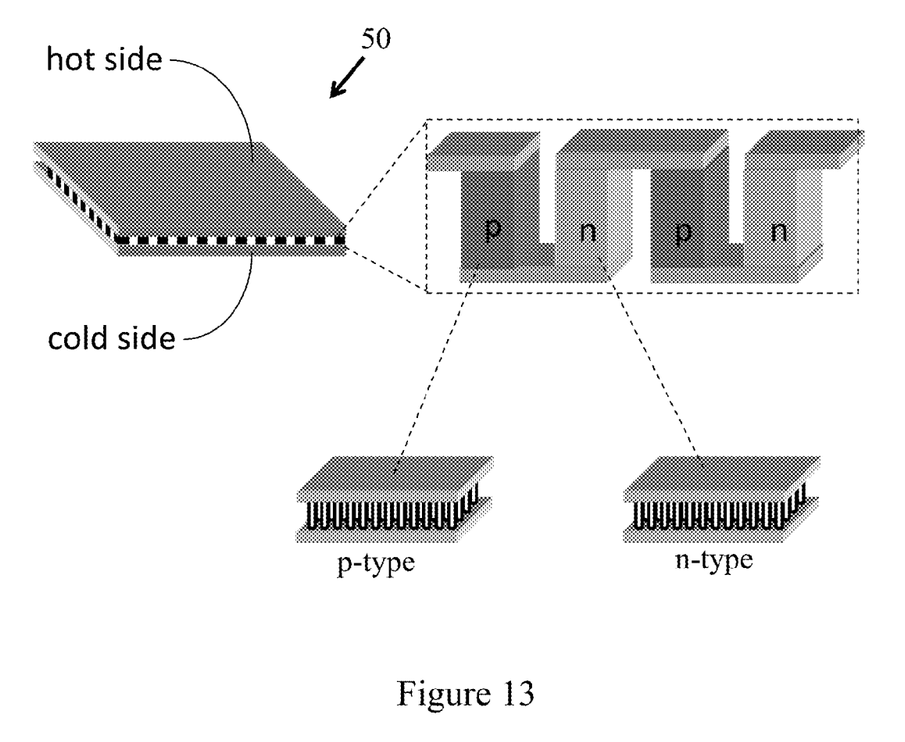
FIG. 13 illustrates structure of a thermoelectric converter based on nanowire arrays.

A typical thermoelectric device will generally comprise a plurality of thermoelectric elements as described above, the elements being arranged side by side with the central axes thereof substantially parallel and aligned with each other. Each element extends between electrical contacts at the ends of its body, where a given pair of contacts may be may be common to all, or a subset, of the overall set of elements in the device. For example, a nanowire array 45 may be employed as indicated in FIG. 12. The device shown schematically in this figure comprises a two-dimensional array of nanowire-based thermoelectric elements 46 fixed between metal contact plates 47. (Although shown as perfectly regular array of precisely parallel, straight elements 46, in practice a degree of irregularity is inherent in the fabrication of devices embodying the invention. Individual nanowires may have some degree of curvature, for instance, and may not be perfectly straight identical elements. It suffices that nanowires in the array formation are aligned in a generally parallel arrangement within the limitations of the fabrication process). The structure of an exemplary TEC device 50 based on multiple such nanowire arrays is illustrated in FIG. 13. The overall structure is based on multiple pairs of nanowire arrays, one array in each pair using n-type semiconductor nanowires and the other using p-type semiconductor nanowires. The nanowire arrays are themselves arranged in a parallel array formation and connected in series electrically for current generation.

While exemplary embodiments have been described above, many alternative embodiments can be envisaged. For example, thermoelectric elements embodying the invention may employ a combination of stressor layers and body-shape variation to achieve the desired strain modulation. In a particular embodiment, for instance, stress may be applied via a stressor layer extending over all sections s1, s2 with the strain being modulated via a difference in shape between the body-sections s1, s2. In general in embodiments of the invention, in any section s1, s2 which is strained, the strain need not necessarily be constant in that section along the direction of central axis CC. Body-shape need not be constant over a section, for instance, and/or stressor layer thickness could be varied along the axial direction. Embodiments can also be envisaged in which stressor layers applying different stress are formed on sections s1 and s2. The stressor layer on one section may be harder than that on the other. Such stressor layers may have a different thickness for example.

Various other materials and element geometries can be employed to achieve energy barrier formation via a strain differential according to basic the principles described above.

While elements will generally have a plurality of pairs of sections s1, s2 for practical reasons, a single pair of sections suffices for energy barrier formation. The lengths of sections s1, s2 may vary in different embodiments, though section lengths between about 1 and 1000 nm, and more usually between about 10 and 100 nm, will be desirable for efficient operation. In general, feature sizes may vary as desired provided the required functionality is achieved.

It will be appreciated that many other changes and modifications can be made to the exemplary embodiments described without departing from the scope of the invention.

The invention claimed is:

1. A thermoelectric element, comprising:
a body formed of a single thermoelectric material and extending in a first direction along a central axis of the body in which a thermal gradient is established in thermoelectric operation,
wherein the body has a first section, a second section, and a third section, each of the first section, the second section, and the third section sharing the same central axis as the central axis of the body, the first section and the second section being directly adjacent sections in the first direction and the second section and the third section being directly adjacent sections in the first direction, the first section, the second section, and the third section formed from only the single thermoelectric material, the first section and the third section have the same constant cross-sectional diameter in each of both directions perpendicular to the first direction, different from the cross sectional diameter of the second section in both directions perpendicular to the first direction and smaller than the cross-sectional diameter of the second section, and each of the sections has a length in the first direction in a range of about 1 to 1000 nanometers (nm).

2. The thermoelectric element of claim 1, wherein the surface of at least one of the first section, the second section, and the third section is shaped to scatter phonons for reducing thermal conductance of the body.

3. The thermoelectric element of claim 1, wherein the body has a plurality of the first section, the second section, and the third section in the first direction.

4. The thermoelectric element of claim 1, wherein the body comprises a nanowire.

5. The thermoelectric element of claim 1, wherein each of the first section, the second section, and the third section has a length in the first direction in a range of about 10 to 100 nm.

6. The thermoelectric element of claim 1, further comprising an electrical contact at each end of the body in the first direction.

7. A thermoelectric structure comprising a plurality of thermoelectric elements as claimed in claim 1, the elements being arranged in a stack with the central axes thereof substantially parallel and aligned with each other.

8. The thermoelectric structure of claim 7, wherein the elements in the stack are integrally formed with one another.

* * * * *